(12) United States Patent
Tsukude

(10) Patent No.: US 7,693,004 B2
(45) Date of Patent: Apr. 6, 2010

(54) SEMICONDUCTOR MEMORY DEVICE

(75) Inventor: Masaki Tsukude, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 98 days.

(21) Appl. No.: 12/014,071

(22) Filed: Jan. 14, 2008

(65) Prior Publication Data

US 2008/0205184 A1 Aug. 28, 2008

(30) Foreign Application Priority Data

Feb. 26, 2007 (JP) ............................. 2007-045401

(51) Int. Cl.
*G11C 8/00* (2006.01)
(52) U.S. Cl. .................................. 365/230.06; 365/226
(58) Field of Classification Search ............ 365/230.06, 365/226, 154
See application file for complete search history.

(56) References Cited

U.S. PATENT DOCUMENTS

| | | | |
|---|---|---|---|
| 6,222,780 B1 | 4/2001 | Takahashi | |
| 6,370,063 B2 * | 4/2002 | Kim | ...................... 365/185.23 |
| 7,046,572 B2 * | 5/2006 | Hansen et al. | ............... 365/229 |
| 7,085,175 B2 * | 8/2006 | Remington et al. | ..... 365/189.09 |
| 7,313,050 B2 * | 12/2007 | Lee et al. | ............... 365/230.06 |
| 2005/0013180 A1 | 1/2005 | Koyama et al. | |

FOREIGN PATENT DOCUMENTS

JP 2000-260186 A 9/2000
JP 2005-38557 A 2/2005

* cited by examiner

*Primary Examiner*—Anh Phung
(74) *Attorney, Agent, or Firm*—Miles & Stockbridge P.C.

(57) ABSTRACT

This invention discloses a semiconductor memory device having a voltage supply circuit for generating a driver power supply voltage. The voltage supply circuit is provided with a first voltage supply circuit for precharging the driver power supply voltage to a power supply voltage level of a memory cell, and a second voltage supply circuit for supplying a voltage lower than the power supply voltage level of the memory cell as the driver power supply voltage.

14 Claims, 14 Drawing Sheets

SEMICONDUCTOR MEMORY DEVICE

CROSS-REFERENCE TO RELATED APPLICATIONS

The disclosure of Japanese Patent Application No. 2007-45401 filed on Feb. 26, 2007 including the specification, drawings and abstract is incorporated herein by reference in its entirety.

BACKGROUND OF THE INVENTION

The present invention relates to a semiconductor memory device and, more particularly, to a configuration of a static semiconductor memory device capable of stably reading data.

The term "MOS" originally stands for Metal-Oxide-Semiconductor as a stack structure. However, particularly in a field effect transistor having a MOS structure (hereinbelow, simply called "MOS transistor"), materials of a gate insulating film and a gate electrode are improved from the viewpoint of improvement in integration and manufacturing process in recent years.

For example, in a MOS transistor, from the viewpoint of, mainly, forming a source and a drain in a self-aligning manner, polysilicon is employed in place of a metal as the material of the gate electrode. From the viewpoint of improving the electric characteristic, a material having high dielectric constant is employed as the material of the gate insulating film. The material is not always limited to an oxide.

Therefore, the term "MOS" is not always limited to the stack structure of metal/oxide/semiconductor. In the specification as well, such limitation is not the precondition. That is, in view of the technical common sense, the term "MOS" means not only the abbreviation of metal/oxide/semiconductor but also includes a stack structure of conductor/insulator/semiconductor in a broad sense. Therefore, in the specification, the term "MOS transistor" refers to an insulated gate field effect transistor in which a gate electrode and a source/a drain are electrically (galvanically) isolated from each other.

As a transistor element is becoming finer, the influence of fluctuation in manufacture parameters increases, variations in the threshold voltage of a MOS transistor as a component of a memory cell become large, and the operation margin decreases. As a result, in a semiconductor memory device in low-voltage operation, it becomes difficult to read data stably.

A configuration directed to assure stable data reading operation also under such operating conditions is proposed.

In patent document 1 (Japanese Unexamined Patent Publication No. 2005-38557), a level shifter is used for a word line driver to drive a word line at a voltage level lower than that of a power supply voltage of a memory cell, thereby assuring a margin at the time of reading.

SUMMARY OF THE INVENTION

In the configuration shown in the patent document 1, a memory cell transistor takes the form of a thin film transistor (hereinbelow, called TFT). Even in the case where the threshold voltage of the TFT varies, by changing the voltage amplitude of a selected word line by the level shifter, the margin at the time of reading is improved. Concretely, in the patent document 1, at the time of reading data, a selected word line is driven at a voltage level lower than that of the power supply voltage of a memory cell. The gate voltage of an access transistor in the memory cell decreases, the current drivability drops and, as a result, a static noise margin (hereinbelow, abbreviated as SNM) is assured and data destruction at the time of reading data can be prevented.

The voltage of the selected word line in the patent document 1 is shifted with respect to the power supply voltage of the memory cell by the level shifter. However, the voltage level is fixed when the word line is driven, and rising speed of the word line is not considered.

In the case of driving the word line to a selection state at high speed, the current drivability of the word line driver is increased, so that the current supply capability of a circuit for generating a word line selection voltage has to be increased. However, in the case of increasing such current driving force, the transistor size increases, the occupation area of the word line driver or a circuit for generating a word line voltage enlarges. The patent document 1 does not consider the occupation area of the circuit for driving a word line to the selection state.

Therefore, an object of the present invention is to provide a semiconductor memory device realizing higher rising speed of a word line while assuring a read margin.

Another object of the invention is to provide a semiconductor memory device realizing reduced size of a voltage supply circuit.

According to an embodiment of the present invention, there is provided a semiconductor memory device including a voltage supply circuit for supplying a voltage having a power supply voltage level of a memory cell at the time of rising a word line and, after lapse of predetermined time, supplying a voltage whose level is lower than the power supply voltage level of the memory cell.

The voltage supply circuit includes, preferably, a first voltage supply circuit for precharging a source line of a word line driver to a power supply voltage level of a memory cell before rising of a word line, and a second voltage supply circuit for supplying a voltage whose level is lower than the power supply voltage level of the memory cell.

In the semiconductor memory device of the embodiment, after rising of the word line, the voltage of the power supply node of the word line driver is set to be lower than the power supply voltage of the memory cell. Therefore, the voltage of a selected word line at the time of reading can be made low, the drivability of the access transistor in the memory cell is decreased, and the SNM at the time of reading is improved, that is, data destruction at the time of reading data can be prevented.

At the time of rising of a word line, the voltage of the power supply node of the word line driver is set to the same level as that of the power supply voltage of the memory cell. Therefore, the rising speed of the word line can be maintained high.

Further, by providing a first voltage supply circuit including a transistor element for precharging the voltage of the power supply node of the word line driver to the power supply voltage level of the memory cell in addition to the second voltage supply circuit, the area of transistor elements constructing the voltage supply circuit can be decreased. As a result, the area of the whole voltage supply circuit can be reduced.

DETAILED DESCRIPTION OF PREFERRED EMBODIMENTS

First Embodiment

Figure 1:
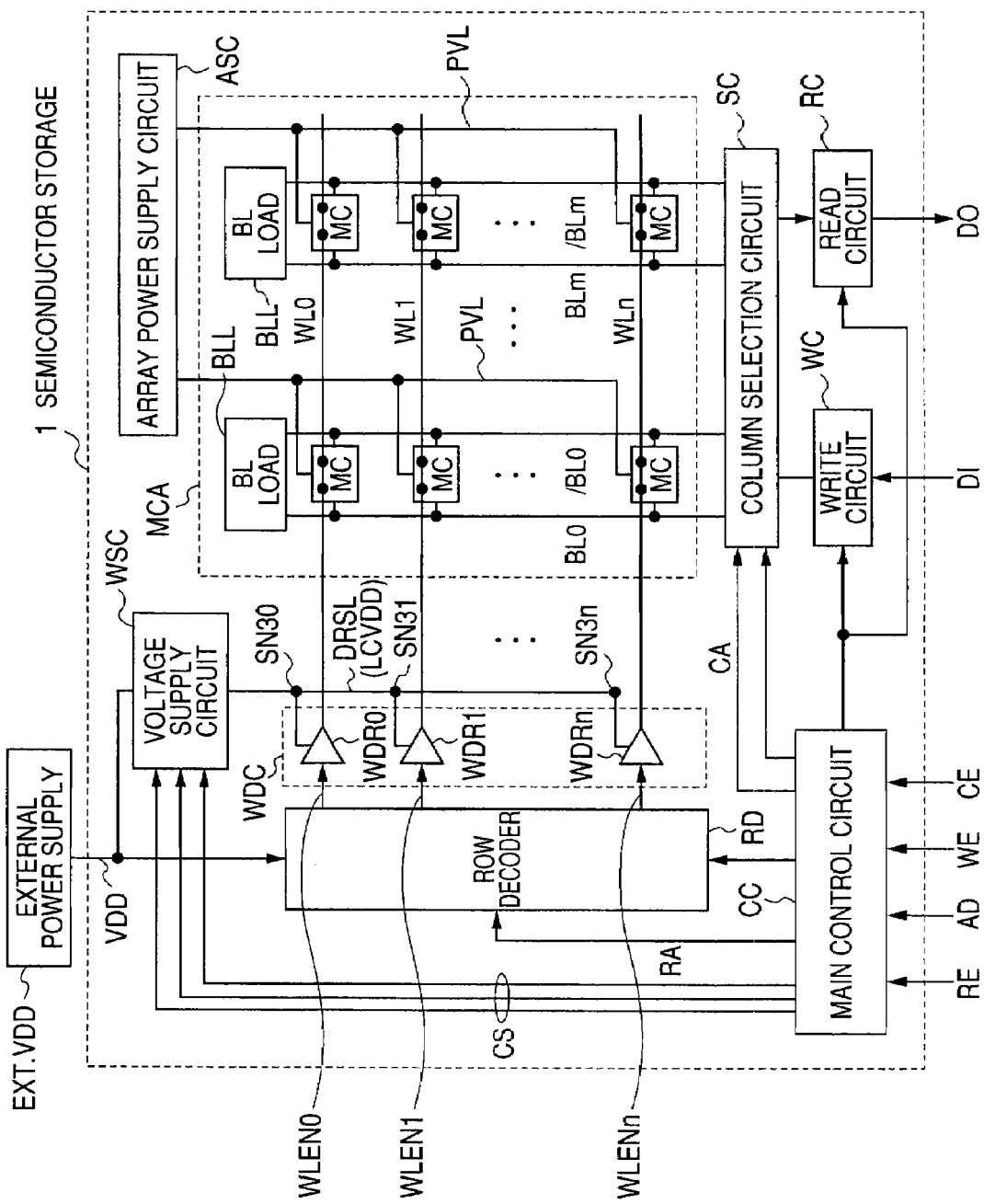
FIG. 1 is a diagram schematically showing a general configuration of a semiconductor memory device as a first embodiment.

FIG. 1 is a diagram schematically showing a general configuration of a semiconductor memory device 1 as a first embodiment. In FIG. 1, the semiconductor memory device 1 includes a memory cell array MCA in which memory cells MC are arranged in a matrix. In FIG. 1, as an example, the memory cells MC are arranged in "n" rows and "m" columns in the memory cell array MCA.

Word lines WL0 to WLn are arranged in correspondence with the rows of the memory cells MC, and the memory cells MC are connected to word lines WL of the corresponding rows. Bit line pairs BL0 and /BL0 to BLm and /BLm are disposed in correspondence with the columns of the memory cells MC. The memory cell MC is a static memory cell and complementary data is transmitted to the complementary bit line pairs BL0 and /BL0 to BLm and /BLm.

In correspondence with each of the pairs of bit lines BL and /BL, a bit line load (BL load) BLL is provided. At the time of reading memory cell data, the bit line load BLL pulls up a corresponding bit line voltage and supplies column current to the corresponding pair of bit lines BL and /BL.

The semiconductor memory device 1 further includes a row decoder RD for generating row selection signals WLEN0 to WLENn in accordance with an internal row address signal RA, and a word line drive circuit WDC for driving a selected word line WL in the memory cell array MCA to a selection state in accordance with the row selection signals WLEN0 to WLENn from the row decoder RD. The row decoder RD operates on a power supply voltage VDD received from an external power supply EXT.VDD, decodes the internal row address signal RA, and generates the row selection signals WLEN0 to WLENn. A row selection signal corresponding to a row designated by the internal row address signal RA is driven to the selection state, and the remaining row selection signals are maintained in a non-selection state.

The word line drive circuit WDC includes word line drivers WDR0 to WDRn provided in correspondence with the word lines WL0 to WLn, respectively. Each of the word line drivers WDR0 to WDRn drives a corresponding word line WL to the selection state in accordance with any of the row selection signals WLEN0 to WLENn from the row decoder RD. Driver power supply nodes SN30 to SN3$n$ of the word line drivers WDR0 to WDRn receive a driver power supply voltage LCVDD as an operation power supply voltage via a driver power supply line DRSL and, when a corresponding word line WL is selected, transmit the driver power supply voltage LCVDD to the corresponding word line WL.

The driver power supply voltage LCVDD is supplied from a voltage supply circuit WSC. The voltage supply circuit WSC precharges the driver power supply voltage LCVDD to the power supply voltage level (VDD) of the memory cell MC before the word line WL is set to the high level (charges a not-shown capacitor). At the time of setting the word line WL to the high level, the voltage supply circuit WSC supplies the driver power supply voltage LCVDD at a power supply voltage level of the memory cell MC stored in the capacitor by the precharging. After that, the power supply circuit WSC supplies the driver power supply voltage LCVDD at a voltage level lower than that of the power supply voltage of the memory cell MC. The operation of the voltage supply circuit WSC will be described in detail later.

The semiconductor memory device 1 further includes: a column selection circuit SC for selecting the pair of complementary bit lines BL and /BL corresponding to the column selected in accordance with an internal column address signal CA; a write circuit WC for transmitting write data to the pair of bit lines BL and /BL corresponding to the column selected by the column selection circuit SC at the time of writing data; and a read circuit RC for detecting data from the pair of bit lines BL and /BL corresponding to the column selected by the column selection circuit SC, amplifying the data, and generating read data at the time of reading data.

The semiconductor memory device 1 further includes a main control circuit CC for generating the internal row address signal RA, the internal column address signal CA, and control signals necessary for various operations in accordance with an address signal AD, a write instruction signal WE, a read instruction signal RE, and a chip enable signal CE which are supplied from the outside.

The main control circuit CC generates a control signal CS for controlling the operation of the power supply circuit WSC in accordance with the external write instruction signal WE and the external read instruction signal RE. As shown in FIG. 1, the main control signal CS includes a plurality of control signals. For example, the main control signal CS includes a first control signal PREN, a second control signal UPEN, and a third control signal DWEN which will be described later. Although the voltage supply circuit WSC for generating the word line selection voltage is shown distinguished from the main control circuit CC, the power supply circuit WSC may be included in the main control circuit CC.

The write circuit WC includes a not-shown input buffer and a not-shown write drive circuit and, at the time of writing data, generates internal write data in accordance with write data DI from the outside. The read circuit RC includes a not-shown sense amplifier and a not-shown output buffer and, in a data reading mode, buffers data detected and amplified by the sense amplifier, thereby generating external read data DO. The operations of the write circuit WC and the read circuit RC are controlled by the main control circuit CC.

The memory cell array MCA is further provided with an array power supply circuit ASC. Array power supply voltage from the array power supply circuit ASC is supplied to an H-side power supply node VH and an L-side power supply node VL of the memory cell MC via a cell power supply line PVL. The voltage supplied to the H-side power supply node VH is the power supply voltage of the memory cell MC, and the voltage supplied to the L-side power supply node VL is a reference voltage of the memory cell MC. In FIG. 1, for simplicity, supply of the power supply voltage and the reference voltage is drawn by single lines.

Figure 2:
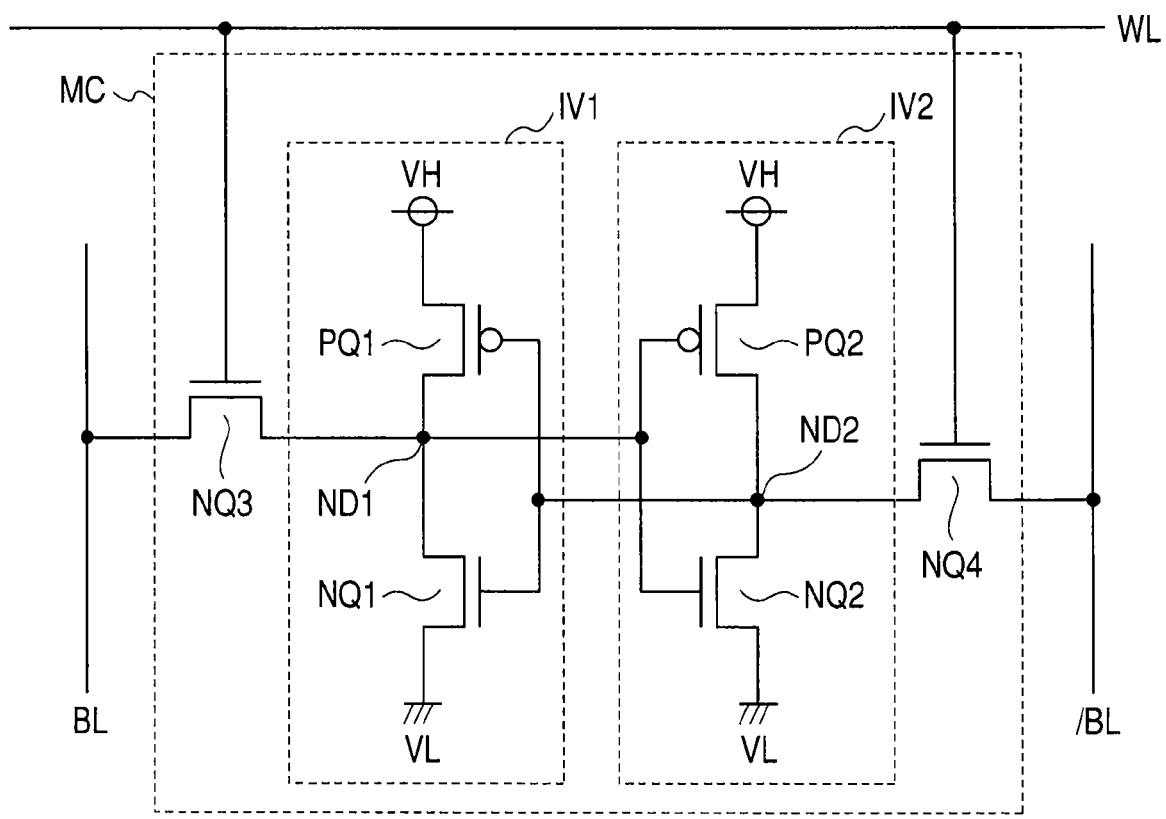
FIG. 2 is a diagram showing an example of the configuration of a memory cell in FIG. 1.

FIG. 2 is a diagram showing an example of the configuration of the memory cell MC illustrated in FIG. 1. In FIG. 2, the memory cell MC takes the form of a full-CMOS single-port static random access memory (hereinbelow, abbreviated as SRAM). Specifically, the memory cell MC is constructed by two CMOS inverters IV1 and IV2 which are cross-connected. The inverter IV1 includes: a P-channel MOS transistor (insulated-gate field-effect transistor; load transistor) PQ1 connected between the H-side power supply node VH and a storage node ND1 and whose gate is connected to a storage node ND2; and an N-channel MOS transistor NQ1 (drive transistor) connected between the storage node ND1 and the L-side power supply node VL and whose gate is connected to the storage node ND2. The other inverter IV2 includes: a P-channel MOS transistor (load transistor) PQ2 connected between the H-side power supply node VH and the storage node ND2 and whose gate is connected to the storage node ND1; and an N-channel MOS transistor NQ2 (drive transistor) connected between the storage node ND2 and the L-side power supply node VL and whose gate is connected to the storage node ND1. The inputs and outputs of the inverters are cross-coupled to construct an inverter latch. Therefore, complementary data is held in the storage nodes ND1 and ND2.

The memory cell MC shown in FIG. 2 further includes N-channel MOS transistors NQ3 and NQ4 (access transistors) for coupling the storage nodes ND1 and ND2 to the bit lines BL and /BL, respectively, in accordance with the voltage on the word line WL.

The word line WL is any of the word lines WL0 to WLn shown in FIG. 1. The pair of bit lines BL and /BL is any of the pairs of bit lines BL0 and /BL0 to BLm and /BLm shown in FIG. 1.

Figure 3:
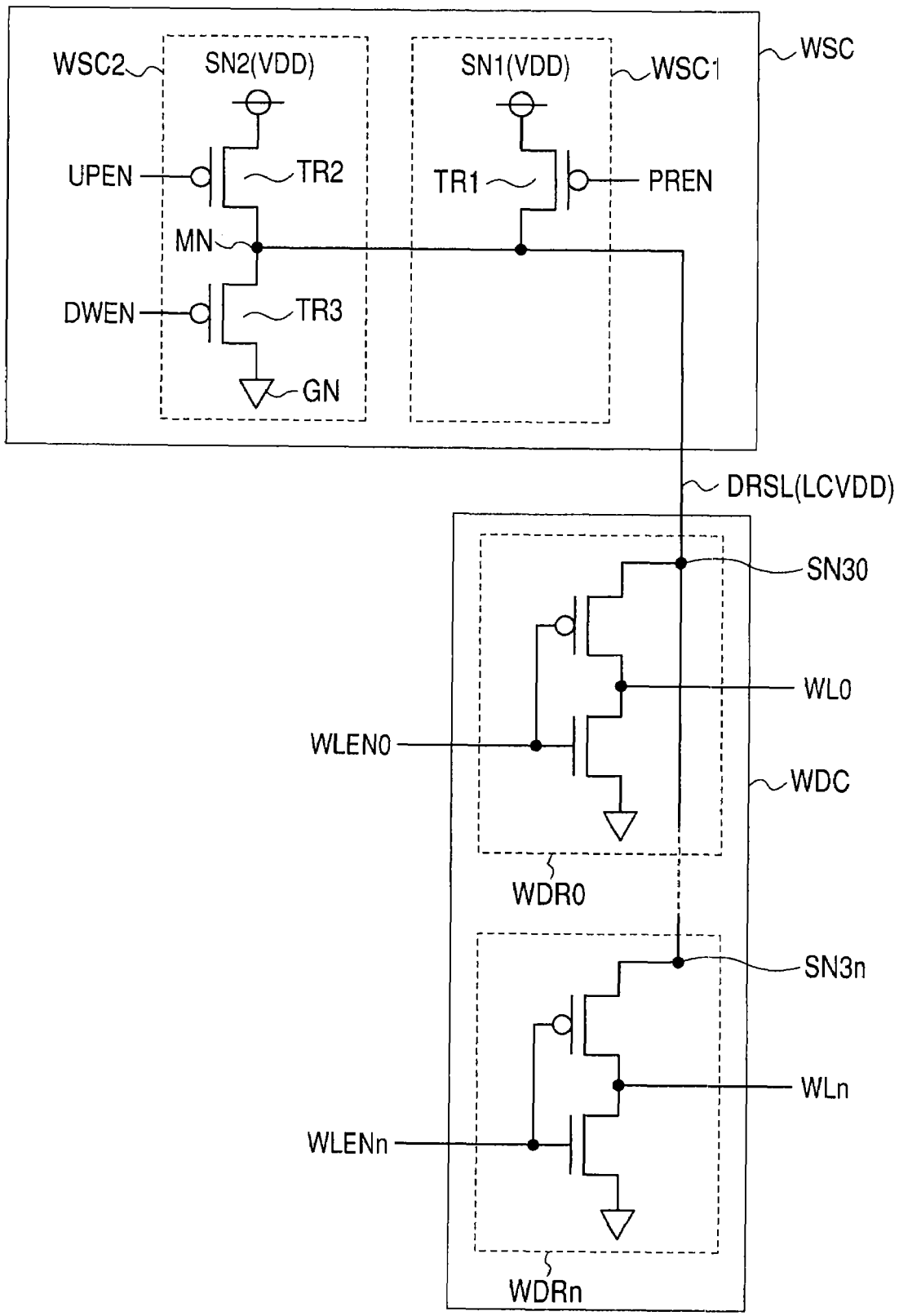
FIG. 3 is a diagram showing an example of a voltage supply circuit in the first embodiment.

FIG. 3 is a diagram showing an example of the voltage supply circuit WSC in the first embodiment. The voltage supply circuit WSC includes a first voltage supply circuit WSC1 for supplying a first power supply voltage and a second voltage supply circuit WSC2 for supplying a second power supply voltage. From the voltage supply circuit WSC, the voltages are supplied to driver power supply nodes SN30 to SN3n of the word line drivers WDR0 to WDRn via the driver power supply line DRSL.

The first voltage supply circuit WSC1 includes the first power supply node SN1 and a first P-channel MOS transistor TR1 connected between the first power supply node SN1 and the driver power supply line DRSL. The first P-channel MOS transistor TR1 is selectively made conductive in accordance with the precharge instruction signal (first control signal) PREN and, when conducted, transmits the voltage of the first power supply node SN1 to the driver power supply line DRSL.

The second voltage supply circuit WSC2 includes second and third P-channel MOS transistors TR2 and TR3 connected in series between the second power supply node SN2 and a reference node GN. The second and third P-channel MOS transistors are connected to each other via an intermediate node MN. The second P-channel MOS transistor TR2 is selectively made conductive in accordance with the up instruction signal (second control signal) UPEN and, when conducted, transmits the voltage of the second power supply node SN2 to the driver power supply line DRSL. The third P-channel MOS transistor TR3 is selectively made conductive in accordance with the down instruction signal (third control signal) DWEN and, when conducted, drives the driver power supply line DRSL to the reference voltage level on the reference node GN.

The voltage VDD supplied to the first and second power supply nodes SN1 and SN2 has a value of the same level as that of the power supply voltage (H-side power supply voltage) supplied to the memory cell MC. Another configuration may be also employed in which the voltage VDD is supplied from the common external power supply EXT.VDD to the first and second power supply nodes SN1 and SN2. By connecting the first and second power supply nodes SN1 and SN2 to the same power supply node, the configuration of the power supply for generating the word line selection voltage is simplified. Alternatively, voltages of different magnitudes may be supplied from different power supplies to the first and second power supply nodes SN1 and SN2. The voltage supplied to the reference node GN has, for example, the reference voltage level of the ground voltage level.

In FIGS. 1 and 3, the first and second voltage supply circuits WSC1 and WSC2 are disposed as the voltage supply circuit WSC but may be disposed separately from each other.

When the first, second, and third control signals PREN, UPEN, and DWEN for controlling conduction/non-conduction of the first, second, and third P-channel MOS transistors TR1, TR2, and TR3 constructing the voltage supply circuit WSC are at the H level, the corresponding P-channel MOS transistors TR1, TR2, and TR3 are made nonconductive. When the signals are at the L level, the corresponding P-channel MOS transistors TR1, TR2, and TR3 are made conductive.

In FIG. 3, the first voltage supply circuit WSC1 is provided commonly to all of the word line drivers WDR.

The first voltage supply circuit WSC1 may be provided for each of the word line drivers WDR.

In FIG. 3, the P-channel MOS transistors TR1 to TR3 are used for the configuration of the voltage supply circuit WSC. To achieve the object of the present invention, the P-channel MOS transistors TR1 to TR3 may be replaced with other devices as long as the devices play the role of a switch. For example, the P-channel MOS transistors TR1 to TR3 may be replaced with N-channel MOS transistors. When the second P-channel MOS transistor TR2 always receives a signal of the L level by its gate, it can be replaced with a resistor.

In the embodiment, all of the MOS transistors constructing the voltage supply circuit WSC are P-channel MOS transistors of the same polarity. By using MOS transistors of the same polarity, an advantage is obtained such that the MOS transistors can be disposed in the same well region. By using MOS transistors of the same polarity as the MOS transistors constructing the second voltage supply circuit WSC2, variations in the threshold voltage can be also suppressed (the threshold voltages of the MOS transistors disposed close to each other vary in the same direction, so that the influence of variations in the threshold voltages can be relatively cancelled off). When those points do not have to be considered, the embodiment can be realized without using only the MOS transistors of the same polarity.

The first P-channel MOS transistor TR1 is connected to the first power supply node SN1. When the first P-channel MOS transistor TR1 is made conductive, the driver power supply voltage LCVDD is pulled up to the level of the voltage VDD supplied to the first power supply node SN1. In the second voltage supply circuit WSC2, when both of the second P-channel MOS transistor TR2 and the third P-channel MOS transistor TR3 are made conductive, the voltage on the driver power supply line DRSL is set to a voltage value obtained by dividing the voltage difference between the power supply node SN2 and the reference node GN at the size ratio of the transistors. The divided voltage becomes the value of the driver power supply voltage LCVDD. Therefore, the voltage supplied from the second voltage supply circuit WSC2 has a value equal to or less than the voltage VDD supplied to the second power supply node SN2 connected to the second P-channel MOS transistor TR2.

Figure 4:
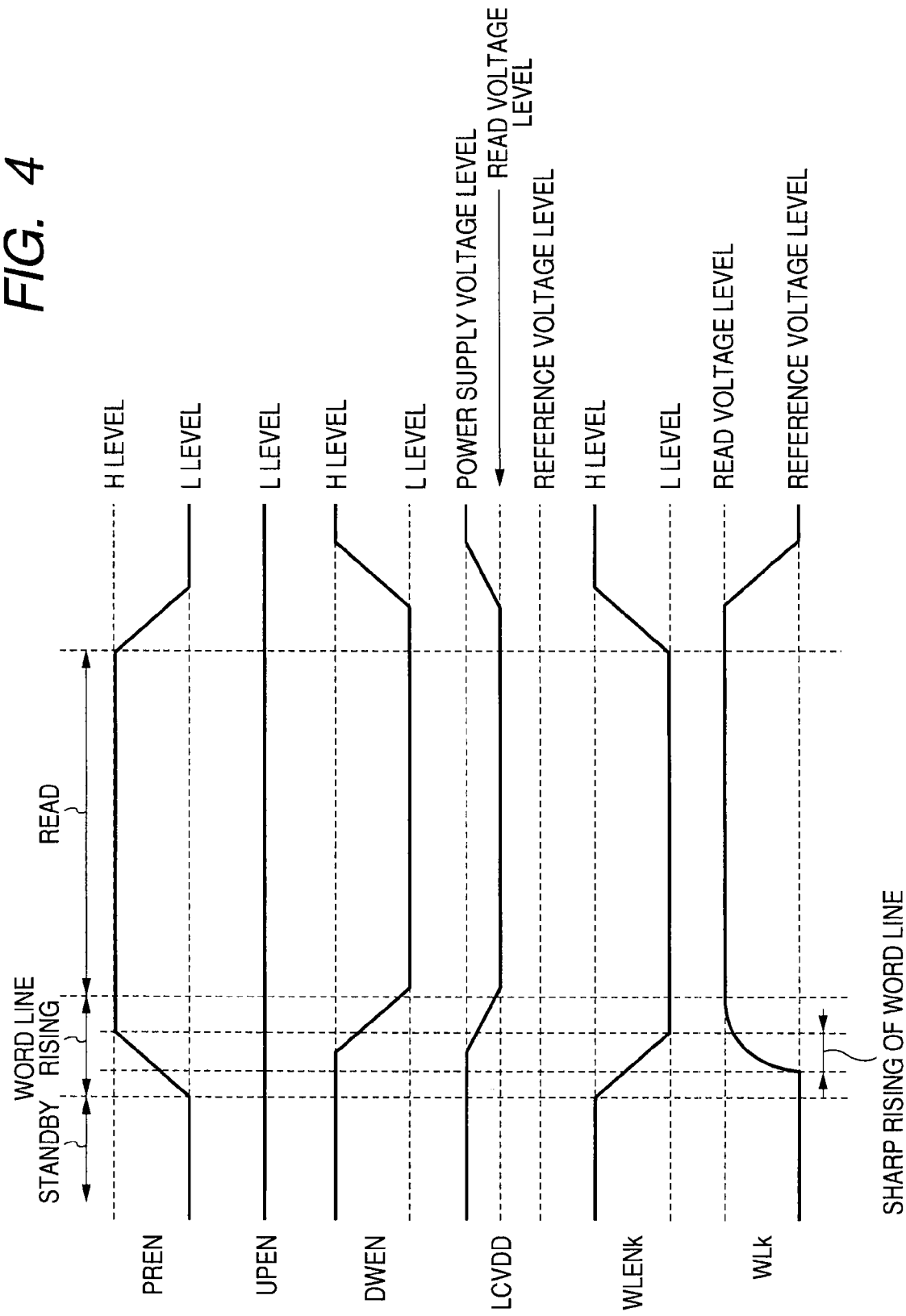
FIG. 4 is a diagram showing an operation of the voltage supply circuit of FIG. 3.

FIG. 4 is a diagram schematically showing the operation of the voltage supply circuit WSC. In FIG. 4, operations are shown by solid lines, and the levels of signals and voltages are shown by broken lines. The operations of the voltage supply circuit WSC are roughly divided into three states; a standby state, a read state, and a word line rising state which is between the standby state and the read state.

First, in the standby state, all of the row selection signals WLEN0 to WLENn (represented by WLENk) are at the H level, and any of the word line drivers WDR0 to WDRn are not selected. All of the word lines WL (represented by WLk) are at the reference voltage level. In the standby state, the first control signal PREN is set to the L level, and the first P-channel MOS transistor TR1 is made conductive. At this time, the voltage supplied from the first power supply circuit WSC1 is stored in the parasitic capacitance in the source line (driver power supply line) DRSL of the word line driver (precharge state). As a result, the drive power supply voltage LCVDD becomes at the level of the voltage VDD supplied to the first power supply node SN1, that is, the same level as that of the power supply voltage of the memory cell MC.

In the period of the standby state, the third control signal DWEN is maintained at the H level and, accordingly, the third P-channel MOS transistor TR3 is in a nonconductive state. The second control signal UPEN is maintained at the L level and the second P-channel MOS transistor TR2 is in the conductive state and supplies current to the driver power supply line DRSL (both of the voltages of the power supply nodes SN1 and SN2 are at the memory cell power supply voltage VDD level).

In the word line WL rising state, according to the read instruction signal RE from the outside, the row selection signal WLENk corresponding to the row whose address is designated is driven from the H level to the L level. The row selection signal WLENk is any of the row selection signals WLEN0 to WLENn. According to the read instruction signal RE, the first control signal PREN is driven from the L level to the H level. Accordingly, the first P-channel MOS transistor TR1 enters the nonconductive state. At this time, the third control signal DWEN is still at the H level.

The voltage of the selection word line WLk is set to the high level by the corresponding word line driver WDRk. The rising of the word line WLk becomes sharp by addition of the level of the voltage VDD stored in the parasitic capacitance of the source line (driver power supply line) DRSL of the word line driver in the standby state. After that, by capacitance division of the capacitance of the source line (driver power supply line) DRSL and the capacitance of the selected word line WLk, the level of the driver power supply voltage LCVDD starts decreasing. Further, the third control signal DWEN is driven from the H level to the L level. By the driving, the third P-channel MOS transistor TR3 is made conductive, and the voltage level of the voltage LCVDD of the driver power supply line DRSL becomes the voltage level set by the voltage dividing ratio between the transistors TR2 and TR3.

Therefore, in the read state, the driver power supply voltage LCVDD is stabilized at the voltage (read voltage) lower than the power supply voltage of the memory cell MC. As the driver power supply voltage LCVDD at this time, a voltage divided at the size ratio of the second P-channel MOS transistor TR2 and the third-P-channel MOS transistor TR3 is supplied. The divided voltage value is at the level lower than that of the power supply voltage VDD, so that the stable reading operation of the memory cell MC is executed. The first control signal PREN is maintained at the H level in the read state.

Under the operating conditions of the voltage supply circuit WSC shown in FIG. 4, the second control signal UPEN is constant at the L-level signal.

Alternatively, in the embodiment, in the standby state and the word line rising state, the second control signal UPEN may be set to the H level, and the second P-channel MOS transistor TR2 may be set to the nonconductive state.

When the SRAM (semiconductor memory device) is not operating, for the purpose of reducing leak current, the second P-channel MOS transistor TR2 may be made nonconductive. In the embodiment, the second control signal UPEN is supplied to the gate of the second P-channel MOS transistor TR2.

Before the rising of the selected word line WLk, the first control signal PREN is driven to the H level, and the row selection signal WLENk is driven to the L level. By changing the timing of switching between the control signals PREN and WLENk, sharpness of the rising of the word line WLk can be also controlled.

By performing a control to switch the row selection signal WLENk to the L level first and, a little after that, switch the first control signal PREN to the H level, the rising of the word line WLk can be made sharper.

On the other hand, by performing a control to switch the first control signal PREN to the H level first and, a little after that, switch the row selection signal WLENk to the L level, sharpness of the rising of the word line WLk can be made slightly gentler.

As shown in FIG. 4, the driver power supply voltage LCVDD is set to the same level (VDD) as that of the power supply voltage of the memory cell MC at the time of rising of the word line WL. After that, the driver power supply voltage LCVDD is set to a level lower than that of the power supply voltage of the memory cell MC. As a result, higher speed of rising of the word line WL at the rising of the word line WL and, after the word line WL rises, stable reading operation of the memory cell MC can be realized.

Figure 5:
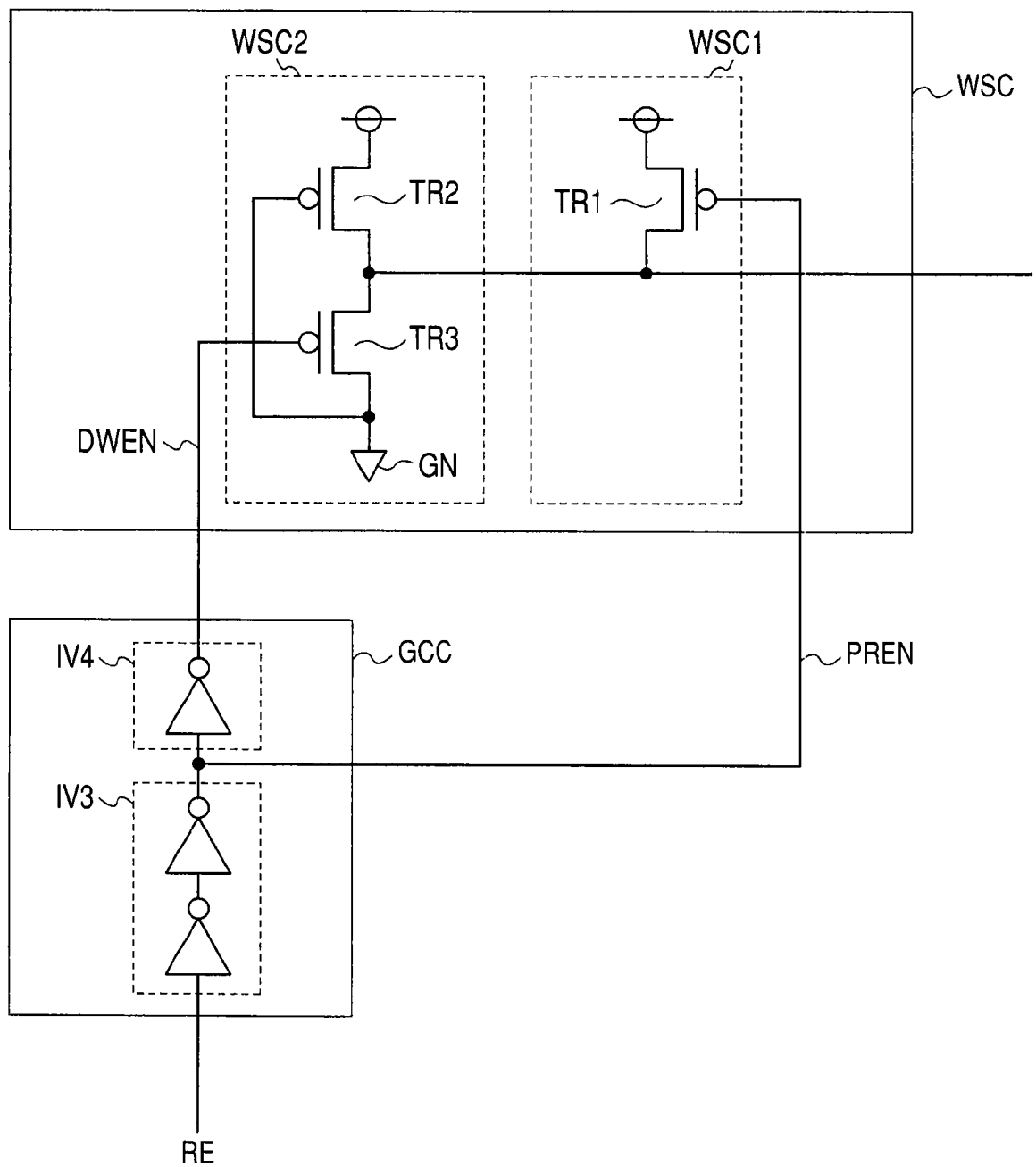
FIG. 5 is a diagram showing an example of a gate signal control circuit.

FIG. 5 shows an example of a gate signal control circuit GCC for generating gate control signals of the P-channel MOS transistors TR1 to TR3 constructing the voltage supply circuit WSC. The gate signal control circuit GCC is disposed in the main control circuit CC shown in FIG. 1. Although the voltage supply circuit WSC is shown separately from the main control circuit CC, it may be disposed in the main control circuit CC as described above.

In FIG. 5, the gate signal control circuit GCC includes an inverter buffer circuit IV3 constructed by two cascade-connected inverters that receive a read instruction signal, and an inverter circuit IV4 for inverting an output signal of the inverter buffer circuit IV3. The inverter circuit IV4 is constructed by a single inverter. The first control signal PREN is generated from the inverter buffer circuit IV3, and the third control signal DWEN is generated from the inverter circuit IV4.

The second control signal UPEN supplied to the gate of the second P-channel MOS transistor TR2 is constant at the L level, so that it is shown by a simplified equivalent configuration in FIG. 5. That is, the second control signal UPEN is maintained at the voltage level on the reference node GN.

Figure 6:
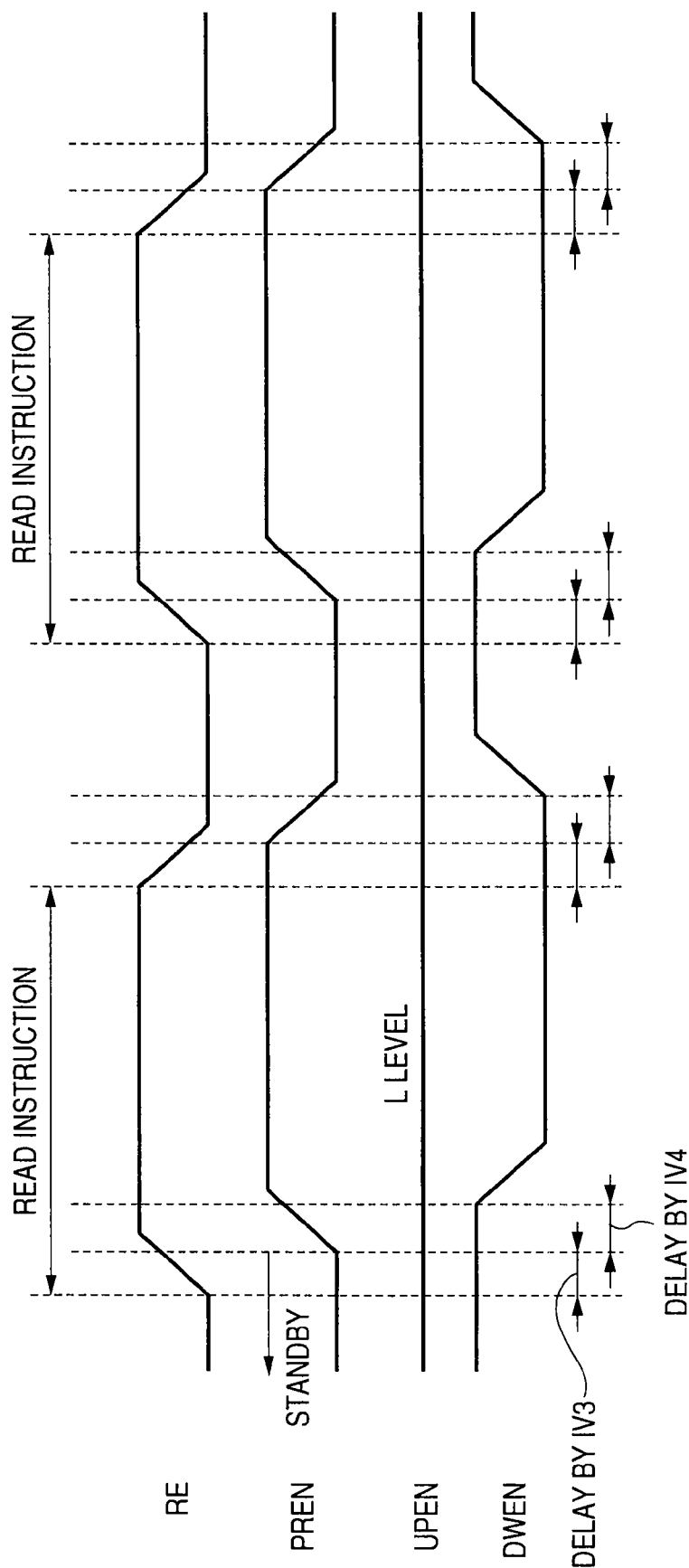
FIG. 6 is a diagram showing the relation between an external input and operations of gate control signals.

FIG. 6 is a diagram showing signal waveforms of the read instruction signal RE and the control signals. The first control signal PREN is generated by inverting the read instruction signal RE twice in total by the inverter buffer circuit IV3. Since the first control signal PREN is generated via the inverter buffer circuit IV3, it is delayed from the read instruction signal RE.

The third control signal DWEN is generated by inverting the read instruction signal RE three times by the inverter buffer circuit IV3 and the inverter circuit IV4. Therefore, the third control signal DWEN is delayed more than the first control signal PREN since the read instruction signal RE passes through the inverter buffer circuit IV3 and the inverter circuit IV4.

As a result, various control signals realizing the operations as shown in FIG. 6 can be generated. By increasing the number of inverters in the circuits in the gate signal control circuit GCC, delay time is changed so that the timing of switching between the conductive and nonconductive states of the first and third P-channel MOS transistors TR1 and TR3 can be varied.

In the embodiment, before start of driving to the non-selection state of the word line WL, the driver power supply voltage LCVDD largely drops below the drive level (precharge level). The first P-channel MOS transistor TR1 to precharge the dropped voltage to the drive level is required to have high drive capability. In the static memory, the circuits such as a row decoder operate statically. The word lines can be driven continuously to the selection state without a precharge cycle of driving all of the word lines once to the non-selection state. Therefore, to drive a non-selected word line to the selection state, the driver power supply voltage LCVDD of the driver power supply line DRSL has to be reset to the precharge voltage level at high speed.

Consequently, the gate electrode width (channel width) of the first P-channel MOS transistor TR1 has to be increased, and the area of the first P-channel MOS transistor TR1 enlarges. The gate electrode width (channel width) of the first P-channel MOS transistor TR1 becomes, although it depends on the capacitance to be precharged (parasitic capacitance in the driver power supply line DRSL), a few times to about ten times as large as that of the second and third P-channel MOS transistors TR2 and TR3.

Figure 7:
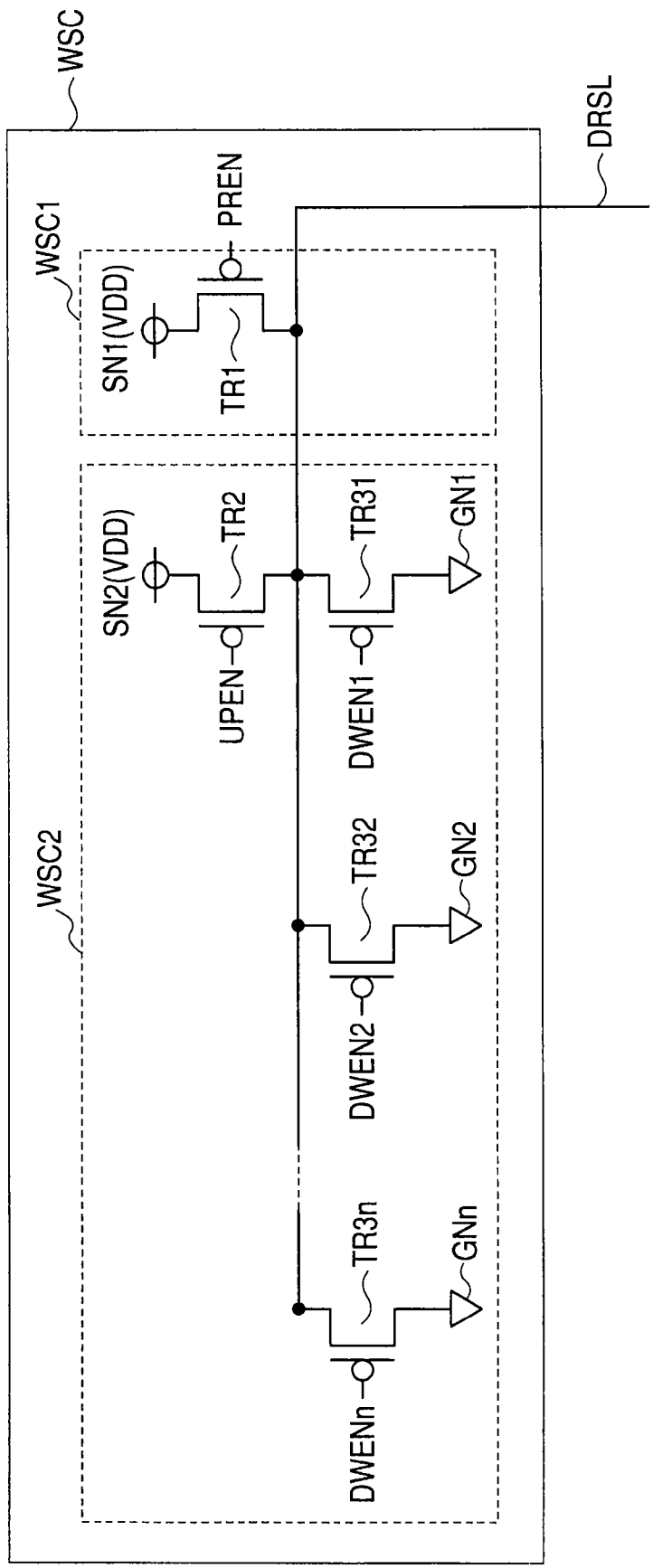
FIG. 7 is a diagram showing a modification of the voltage supply circuit of FIG. 3.

FIG. 7 shows a modification of the voltage supply circuit WSC of FIG. 3. In the voltage supply circuit WSC of FIG. 7, in place of the third P-channel MOS transistor TR3 in FIG. 3, a plurality of third P-channel MOS transistors TR31 to TR3n are provided. One ends (first conduction nodes) of the third P-channel MOS transistors TR31 to TR3n are connected to reference nodes GN1 to GNn, respectively, and the other ends (second conduction nodes) are connected to the driver power supply line DRSL. The conduction/non-conduction state is set by third control signals DWEN1 to DWENn output from the main control circuit CC. The voltage supplied to the reference nodes GN1 to GNn is at the reference voltage level.

In the configuration of FIG. 7, for example, by designing the gate electrode widths (channel widths) of the third P-channel MOS transistors TR31 to TR3n in the same size (the same channel length) and controlling the number of MOS transistors which are made conductive simultaneously, the level of the driver power supply voltage LCVDD supplied from the second voltage supply circuit WSC2 can be adjusted.

In the configuration of FIG. 7, the gate electrode widths (channel widths) of the third P-channel MOS transistors TR31 to TR3n may be designed in different sizes (the channel length is the same), thereby varying the drivability of the third P-channel MOS transistors TR31 to TR3n. According to the voltage value requested for the driver power supply voltage LCVDD, a MOS transistor having the optimum drivability is selected from the third P-channel MOS transistors TR31 to TR3n. By making the selected MOS transistor conductive, the voltage with the required level and drivability can be generated.

For selective conduction of the third P-channel MOS transistors TR31 to TR3n, for example, the gate connection path of the transistors TR1 to TR3n is set by fuse programming. The gate of the transistor which is set in the non-conductive state is connected to the power supply node, and the gate of the transistor which is set in the conductive state is connected to the control signal line for transmitting the third control signal DWEN.

For example, in the case of making the level of the driver power supply voltage LCVDD largely drop below the voltage VDD supplied from the power supply node SN2, a transistor having high drivability is selected and made conductive from the third P-channel MOS transistors TR31 to TR3n. Equivalently, the combined resistance of the third P-channel MOS transistors in the discharge path can be decreased, and the level of the driver power supply voltage LCVDD can be dropped. In addition, the current drivability is increased, and the dropped voltage can be reset to the precharge voltage level at high speed. With such a configuration, the driver power supply voltage LCVDD supplied from the second voltage supply circuit WSC2 can be adjusted.

Similar effects can be also obtained by, except for the configuration of FIG. 7, a configuration using a plurality of P-channel MOS transistors in place of the second P-channel MOS transistor TR2 connected to the second power supply node SN2.

Figure 8:
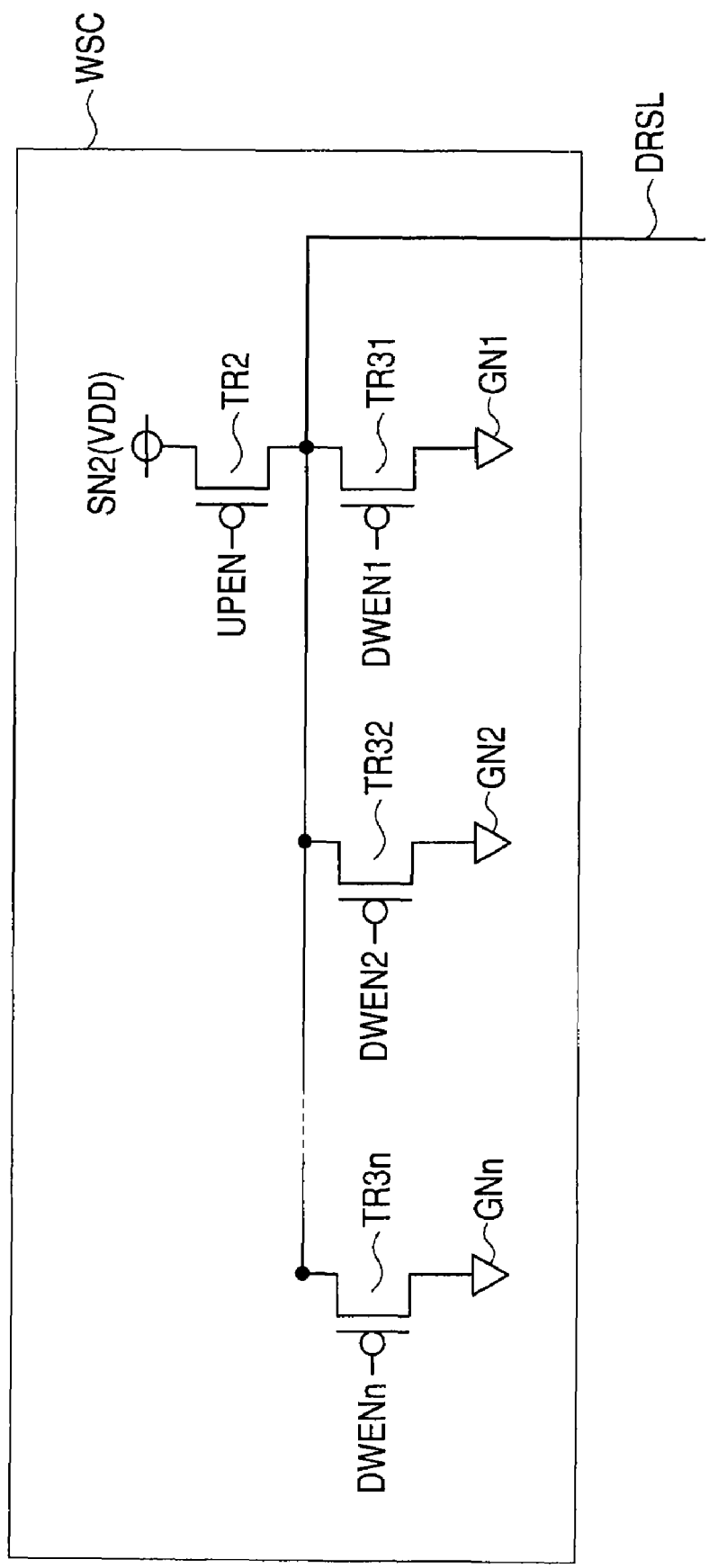
FIG. 8 is a diagram showing a modification of the voltage supply circuit of FIG. 7.

FIG. 8 is a diagram showing further another configuration of the voltage supply circuit WSC. In the configuration shown in FIG. 8, the first P-channel MOS transistor TR1 is not provided in the voltage supply circuit WSC of FIG. 7. The precharge function of the first P-channel MOS transistor TR1 is performed by the second P-channel MOS transistor TR2.

To add the precharge function to the second P-channel MOS transistor TR2 in FIG. 8, the second P-channel MOS transistor TR2 in FIG. 8 is required to have high drivability like the first P-channel MOS transistor TR1 in FIG. 7 and has the drivability higher than that of the second P-channel MOS transistor TR2 in the configuration of FIG. 7.

Further, the third P-channel MOS transistors TR31 to TR3n in FIG. 8 are also requested to have drivability (total current drivability of transistors which are in the conduction state) about the same as that of the first P-channel MOS transistor TR1 in FIG. 7 to promptly drop the voltage used for precharging by the second P-channel MOS transistor TR2.

The voltage supply circuits WSC in FIGS. 7 and 8 are compared with each other. The number of MOS transistors constructing the voltage supply circuit WSC in FIG. 7 is larger than that of MOS transistors constructing the voltage supply circuit shown in FIG. 8.

However, each of the P-channel MOS transistors constructing the voltage supply circuit shown in FIG. 8 needs drivability at the same level as that of the first P-channel MOS transistor TR1 in FIG. 7, and the gate electrode width (channel width) has to be increased.

Consequently, the gate electrode width (channel width) of each of the P-channel MOS transistors constructing the voltage supply circuit shown in FIG. 8 has to be a few times to about ten times as large as that of the second and third P-channel MOS transistors TR2 and TR31 to TR3n constructing the voltage supply circuit shown in FIG. 7.

When the whole areas of the voltage supply circuits WSC of FIGS. 7 and 8 are compared with each other, the area of the voltage supply circuit WSC of FIG. 7 can be made smaller. The area difference of the voltage supply circuits WSC of FIGS. 7 and 8 increases as the number of third P-channel MOS transistors TR31 to TR3n increases. That is, by disposing the first P-channel MOS transistor TR1 dedicated for precharging as shown in FIG. 7, the whole area of the voltage supply circuit WSC can be largely reduced.

Figure 9:
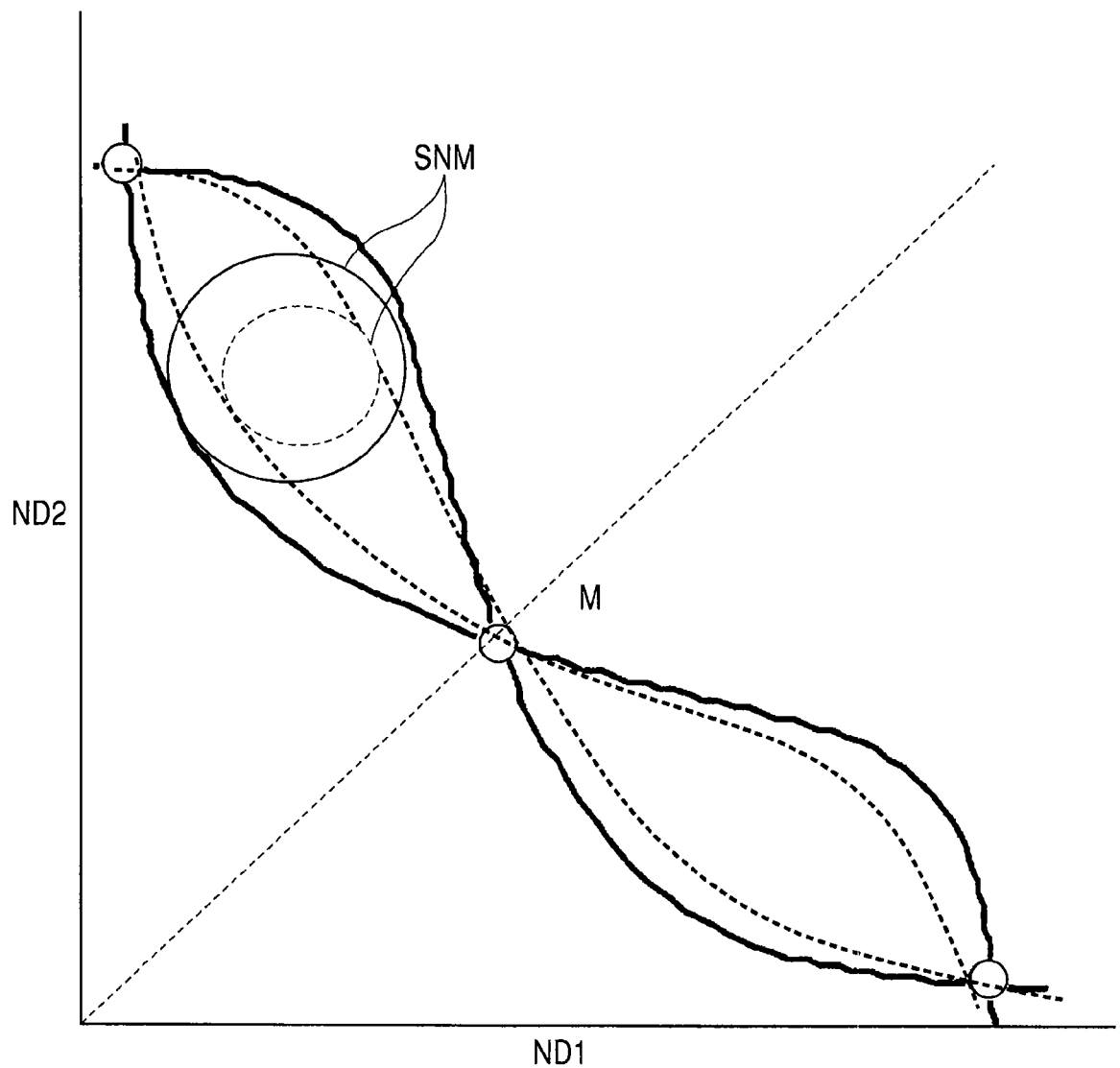
FIG. 9 is a diagram showing a static noise margin of the memory cell of FIG. 1.

FIG. 9 is a diagram showing a static noise margin SNM of the memory cell MC. The transfer characteristics shown in FIG. 9 are input/output transfer characteristics of the two CMOS inverters IN1 and IN2 included in the memory cell MC. In FIG. 9, curves shown by broken lines indicate the transfer characteristics of the storage nodes ND1 and ND2 in the case where the voltage of the selection word line WL is at the power supply voltage VDD level. The static noise margin SNM is shown by the diameter of an inscribed circuit of a broken line between curves shown by broken lines (or the diagonal line of a square).

In FIG. 9, when the absolute value of the threshold voltage of the load transistors PQ1 and PQ2 of the memory cell MC increases, the input logic threshold value of the inverter of the memory cell MC shifts to the lower direction. In this state, the current drivability of the load transistors PQ1 and PQ2 decreases, the output node of one inverter is discharged more strongly by the current drivability of the access transistors NQ3 and NQ4, and the possibility that retained data is destroyed increases. Consequently, data retention deteriorates, and the diameter of the inscribed circuit of the transmission curve shown by the broken line, that is, the static noise margin SNM decreases.

In this state, the driver power supply voltage LCVDD lower than power supply voltage level (VDD) of the memory cell MC except for the rising period is set to the voltage level of the selected word line WL.

In this case, the conductance of the access transistors NQ3 and NQ4 decreases, rise in the L-level voltage of the storage node of the memory cell MC is suppressed, and the transfer characteristic curve shown by the solid line spreads in a left lower area more than the transfer characteristic of the broken lines. Accordingly, as shown by the diameter of the inscribed circle of the solid line, the static noise margin SNM increases, and there is an effect that the read margin is improved.

The drivability of the word line driver WDR when the word line WL rises up is high since the word line driver WDR is driven at the power supply voltage level of the memory cell MC. There is an effect that the word line voltage rises sharper than that in the case of setting the voltage level of the selected word line WL to the driver power supply voltage LCVDD lower than the power supply voltage of the memory cell MC.

Second Embodiment

Figure 10:
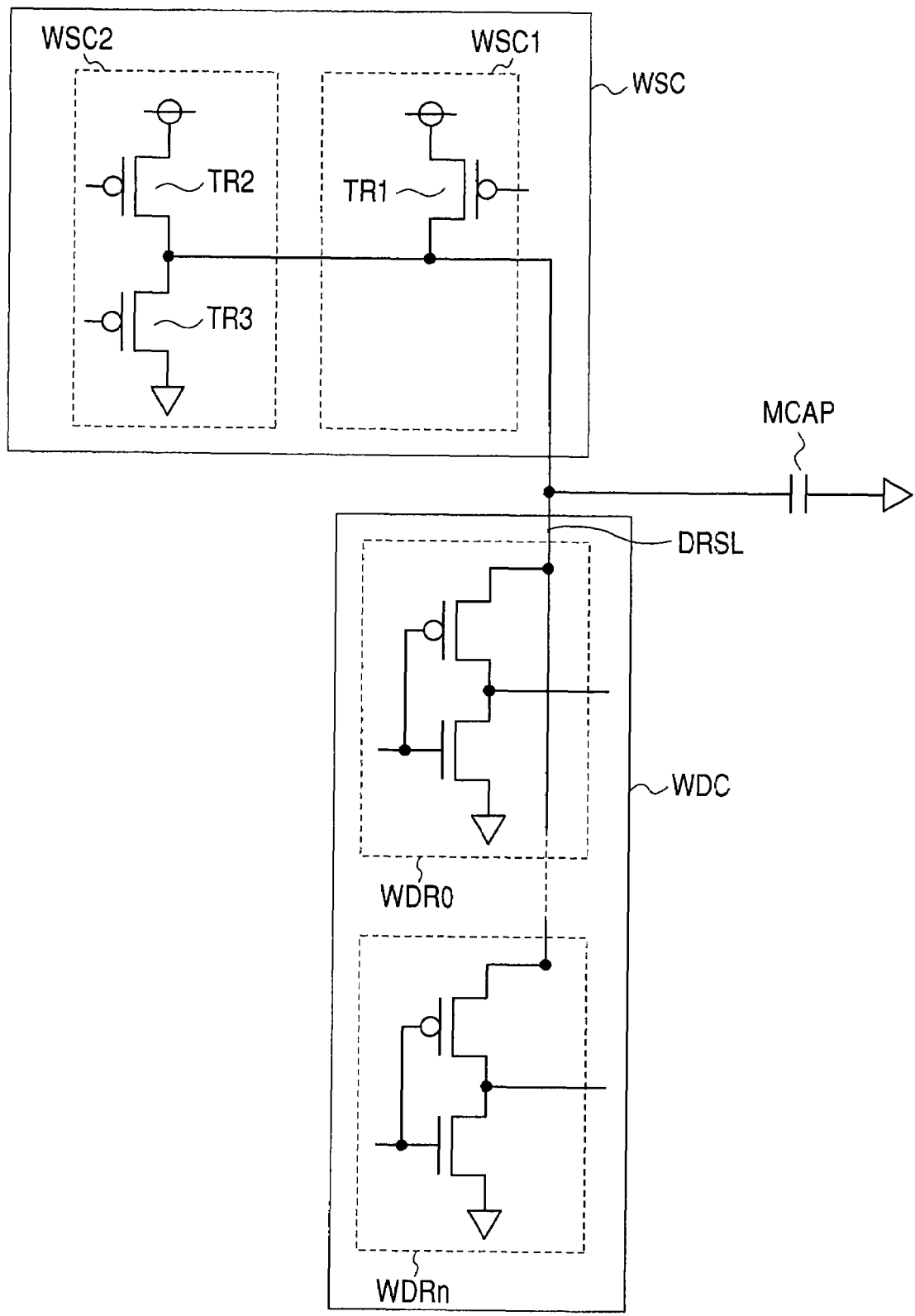
FIG. 10 is a diagram schematically showing a voltage supply circuit and its periphery as a second embodiment.

FIG. 10 is a diagram schematically showing a voltage supply circuit WSC and its periphery as a second embodiment of the invention. The configuration of the voltage supply circuit WSC shown in FIG. 10 is different from that of the voltage supply circuit WSC shown in FIG. 3 with respect to the point that a MOS capacitor MCAP is disposed in the source line DRSL of the word line driver (driver power supply line). The other configuration of the circuit shown in FIG. 10 is the same as that of FIG. 3. The same reference numerals are designated to corresponding parts and their detailed description will not be repeated.

In the first embodiment, the wiring capacity of the source line DRSL of the word line driver (driver power supply line) is used. By using a voltage accumulated in the wiring capacity, the speed of rising of the word line WL is increased. That is, when the wiring capacity of the source line DRSL of the word line driver (driver power supply line) is large, the speed of rising of the word line WL can be increased. By disposing the MOS capacitor MCAP in the source line DRSL of the word line driver as shown in FIG. 10, the capacity can be assured stably, and high speed rise in the word line WL can be realized.

Except for the method of assuring the capacity by adding the MOS capacitor MCAP as shown in FIG. 10, to obtain a similar effect, there is a method of increasing the wiring width of the word line driver source line DRSL. As an example, the wiring width of the word line driver source line (driver power supply line) DRSL is set to twice as wide as that of the wiring disposed as a standard in the word line driver WDR.

In the case of increasing the wiring width of the word line driver source line DRSL, the resistance value decreases, so that the potential at a near end supplied from the voltage supply circuit WSC is supplied to a far end without decreasing. There is also an effect that occurrence of the level difference between both ends of the word line driver WDR is suppressed. The wiring width can be doubled also by using two wires disposed in different wiring layers.

Third Embodiment

Figure 11:
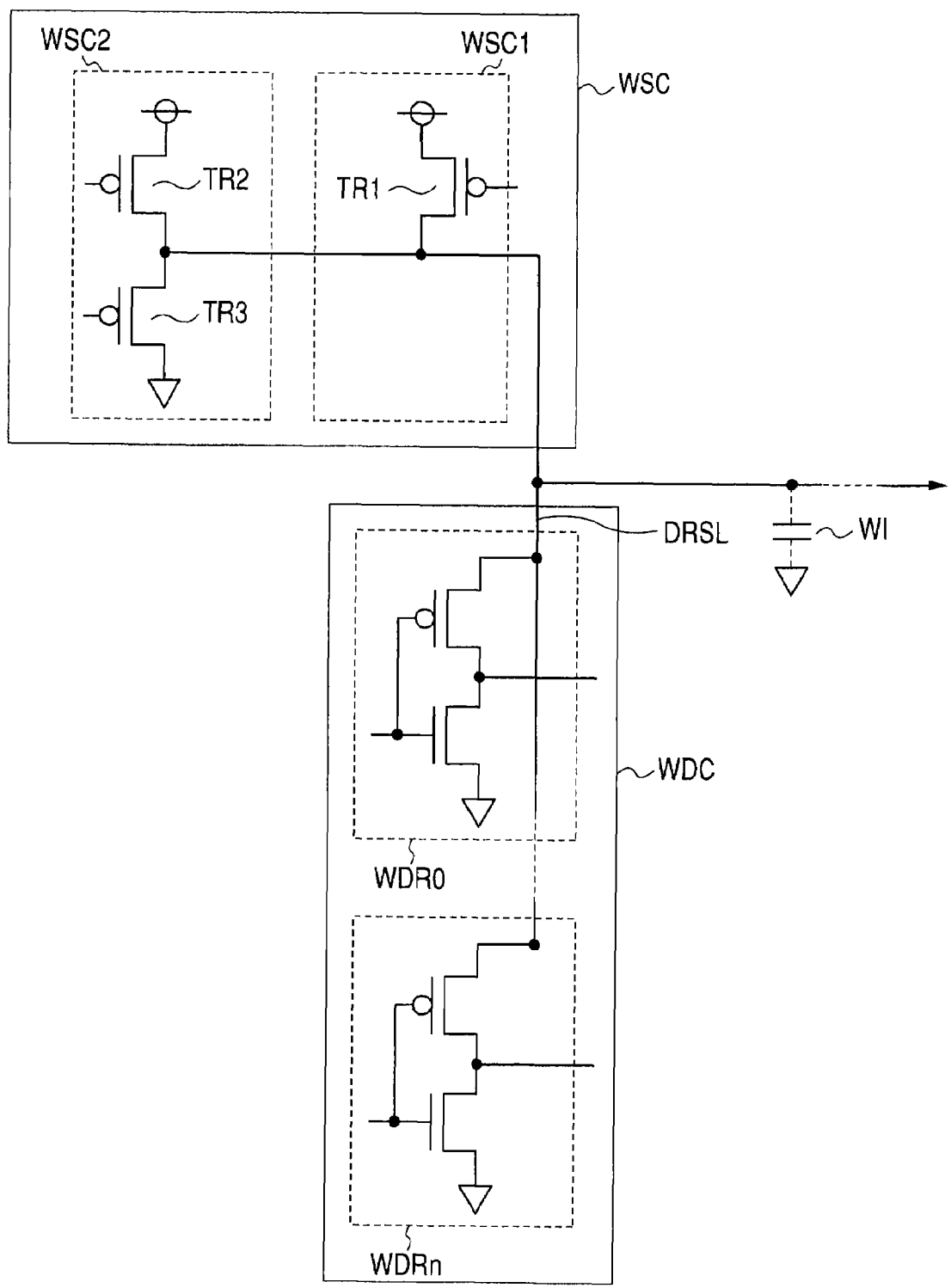
FIG. 11 is a diagram schematically showing a voltage supply circuit and its periphery as a third embodiment.

FIG. 11 is a diagram showing a voltage supply circuit WSC and its periphery according to a third embodiment of the invention. The configuration of the voltage supply circuit WSC shown in FIG. 11 is different from that of the voltage supply circuit WSC shown in FIG. 3 with respect to the point that a wire WI extends in the word line WL direction in addition to the normal wire of the word line driver source line DRSL (driver power supply line). The parasitic capacitance of the wire WI is used as capacitance of holding the precharge voltage of the driver power supply line DRSL.

The other configuration of the circuit shown in FIG. 11 is the same as that of FIG. 3. The same reference numerals are designated to corresponding parts and their detailed description will not be repeated.

Figure 12:
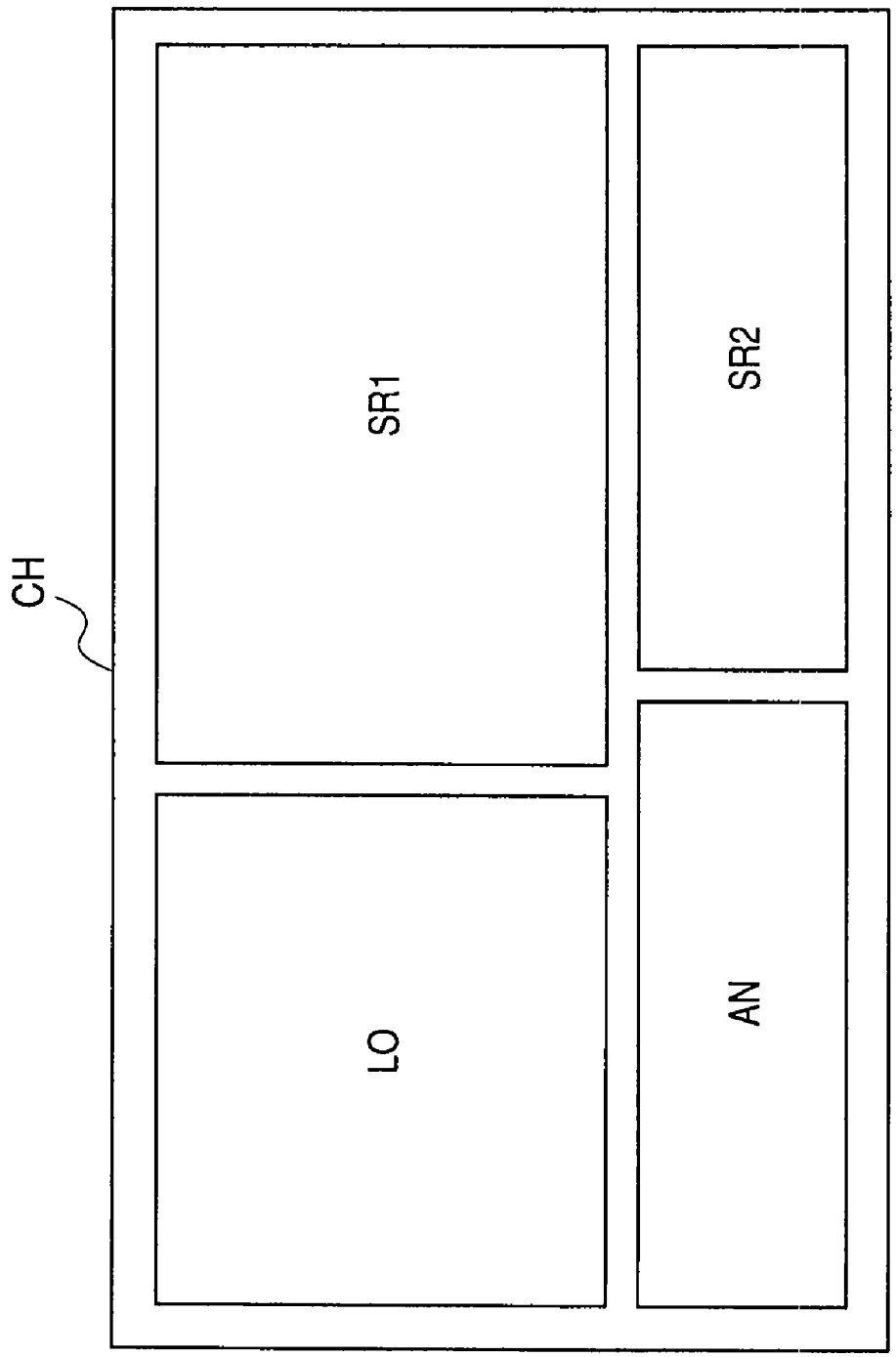
FIG. 12 is a diagram showing an example of the chip configuration of a system LSI.

FIG. 12 shows an example of the configuration of a semiconductor chip CH of a system LSI (Large Scale Integration). In FIG. 12, on the semiconductor chip CH, a number of functions such as a logic unit LO, an analog unit AN, a first static memory SR1, and a second static memory SR2 are integrated.

Since functions to be integrated according to uses of system LSIs are different from each other, chips as final products become different from each other. The shapes and layouts of SRAMs integrated on such system LSIs are not unconditionally the same but often manufactured different from each other among the chips. Therefore, in the case where the SRAM is assembled together with other functions such as the logic unit LO and the analog unit AN as shown in FIG. 12, a number of kinds of word lines WL and a number of kinds of bit lines BL are combined. The configuration is, for example, that of the first and second static memories SR1 and SR2. Generally, a method is employed in which a configuration of combination of the necessary number of word lines WL and the necessary number of bit lines BL is automatically generated, and static semiconductor memories SRAM of a number of configurations are mounted.

Figure 13:
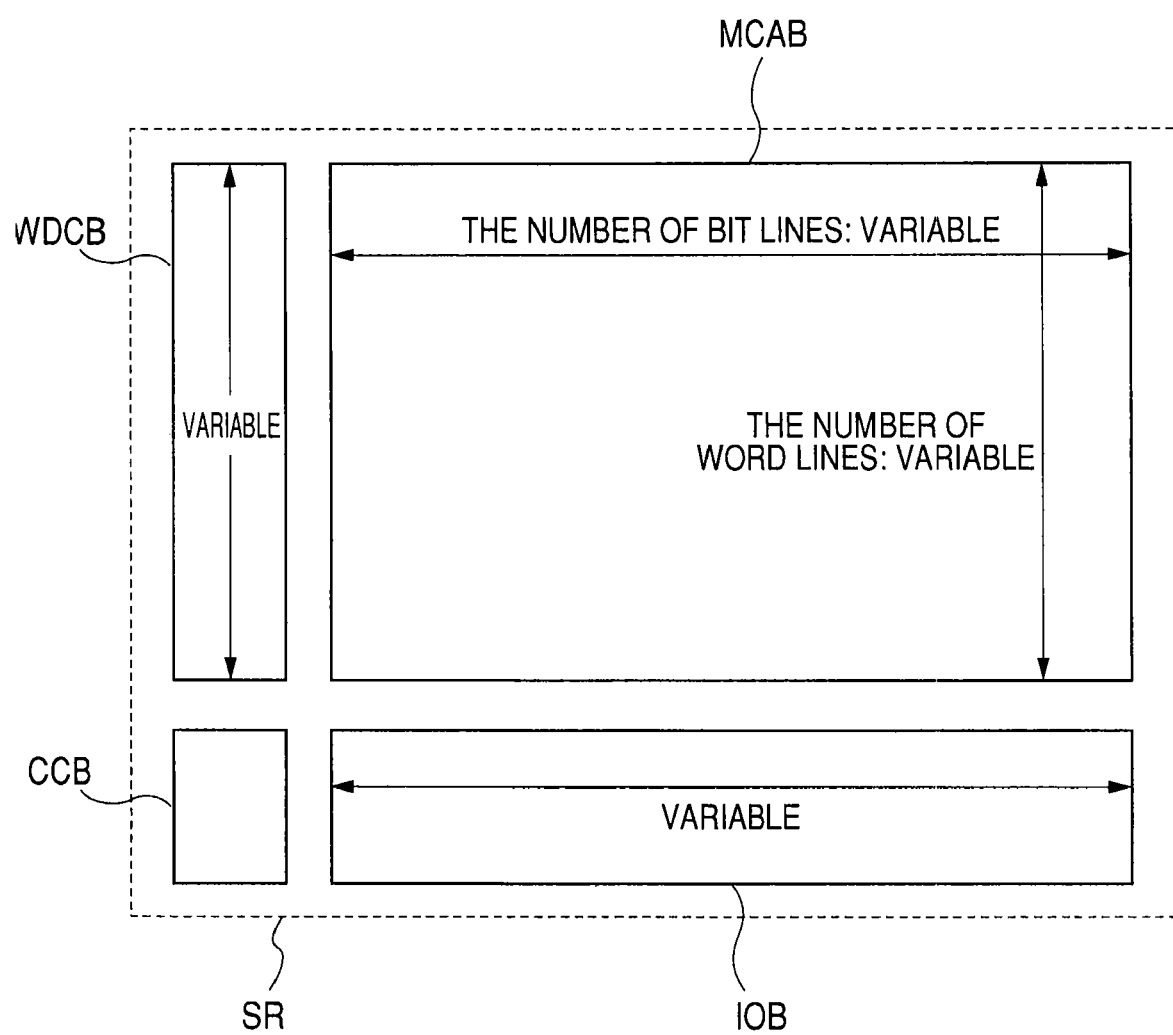
FIG. 13 is a diagram showing the configuration of an SRAM in which the number of word lines and the number of bit lines can be varied.

FIG. 13 shows the configuration of an SRAM in which the number of word lines WL and the number of bit lines BL can be varied. A static memory SR of FIG. 13 includes a word line driver circuit block WDCB, a memory cell array block MCAB, a control circuit block CCB, and an input/output block IOB.

The SRAM assembled together with the logic unit LO and the analog unit AN on the same chip is generated without changing the control circuit block CCB but by changing not only the memory cell array block MCAB but also the word line driver circuit block WDCB and the input/output block IOB in accordance with a configuration using a predetermined number of word lines WL and a predetermined number of bit lines BL. By combining blocks (basic units) each having unit number of word lines and bit lines, a memory cell array block having necessary number of word lines and bit lines is generated.

Figure 14:
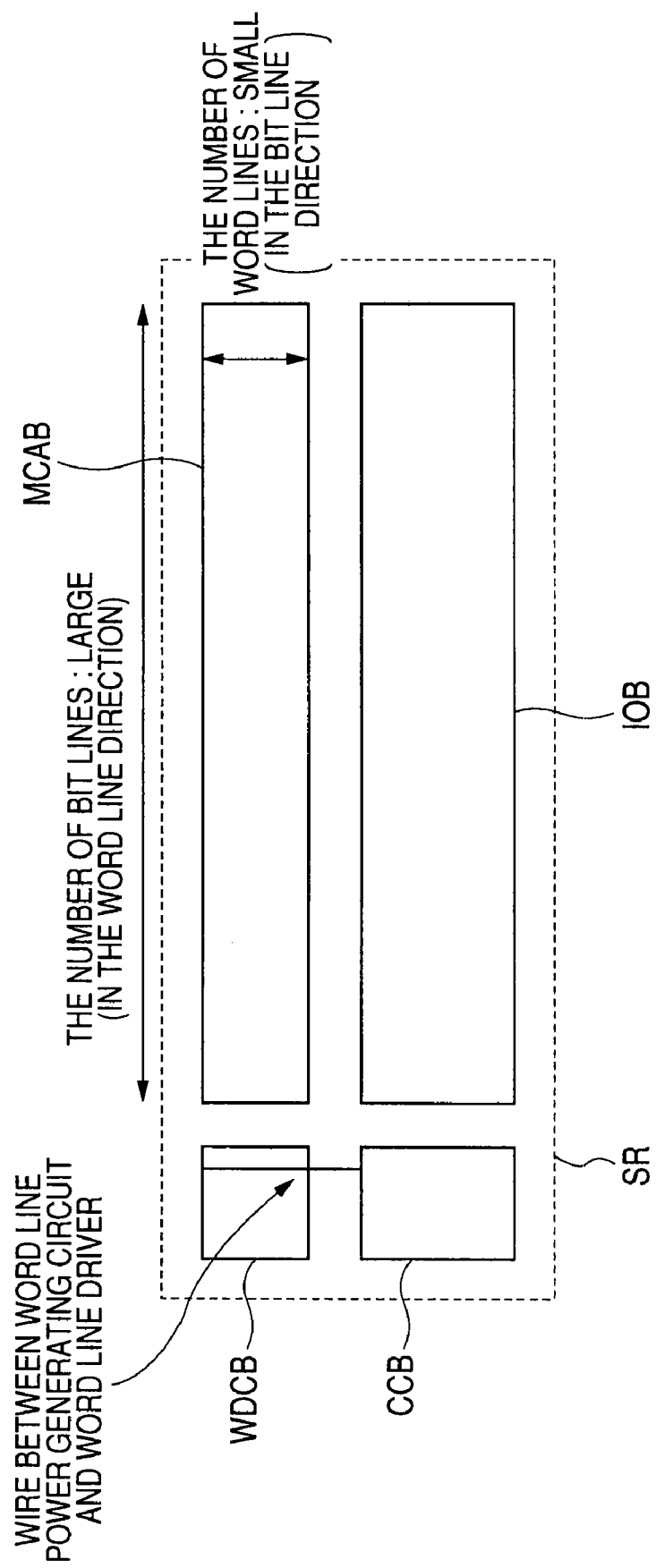
FIG. 14 is a diagram showing the configuration of an SRAM in which the word line direction is much longer than the bit line direction in the configuration of FIG. 13.

FIG. 14 shows the configuration of an SRAM that the word line direction (word line extension direction) is much longer than the bit line direction (bit line extension direction) in the configuration of FIG. 13. The voltage supply circuit WSC is generally disposed in the control circuit block CCB. Therefore, in the configuration where the word line direction is much longer than the bit line direction as shown in FIG. 14, the length of the source line (driver power supply line) DRSL of the word line driver WDR is short, and sufficient parasitic capacitance cannot be obtained. Further, there is the possibility that the capacitance of the word line WL increases, when the word line WL is activated, due to the capacitance division to the wiring capacity of the source line (driver power supply line) DRSL of the word line driver WDR and the capacity of the word line WL, the driver power supply voltage LCVDD level temporary drops extremely, and the rising timing of the word line WL becomes very slow.

That is, a problem occurs such that the rising speed of the word line WL changes depending on the combination of the number of word lines WL and the number of bit lines BL. Generally, since the same circuit is used as the main control circuit CC, there is the possibility that mismatch of timings occurs depending on the combination of the number of word lines WL and the number of bit lines BL.

As shown in FIG. 11, in addition to normal wiring of the word line driver source line DRSL, a wire WI is provided in the word line WL direction. Also in the case where the row direction becomes much longer than the column direction, an effect is produced such that the parasitic capacitance in the word line driver source line DRSL becomes sufficiently large, the capacitance division at the rising of the word line WL is stably performed, and the rising speed of the word line WL does not become extremely low.

In the present invention, the word line WL is risen at high speed by using the capacitance of the wire WI. The rising speed of the word line WL depends on the capacitance of the wiring. In the present invention, therefore, capacitive means for increasing the capacitance of the wire by, for example, intentionally widening the source line (driver power supply line) DRSL is provided. The capacitive means denotes the means described in the second and third embodiments.

The present invention can realize the memory device capable of stably reading data by being applied to a static semiconductor memory device. In particular, in the case where the memory device is mounted together with logic units such as another processor on the same semiconductor chip like an SOC (System On a Chip), a memory system having small chip area and stably operating can be provided.

What is claimed is:

1. A semiconductor memory device comprising:
   a memory cell array in which a plurality of static memory cells are arranged in a matrix;
   a plurality of word lines provided in correspondence with the memory cell rows and coupled to the memory cells in the corresponding rows;
   a plurality of word line drivers provided in correspondence with the word lines and driving the corresponding word lines to a selection state; and
   a voltage supply circuit for selectively supplying a first voltage and a second voltage whose level is different from that of the first voltage to a first power supply node of each of the word line drivers in accordance with an operation mode.

2. The semiconductor memory device according to claim 1,
   wherein the voltage supply circuit includes a first voltage supply circuit for supplying the first voltage, and
   wherein the first voltage supply circuit includes:
      a first transistor having: a second power supply node; a first conduction node coupled to the second power supply node; and a second conduction node coupled to the first power supply node of the word line driver, the first transistor being selectively made conductive on receipt of a first control signal by its gate.

3. The semiconductor memory device according to claim 1,
   wherein the voltage supply circuit includes a second voltage supply circuit for supplying the second voltage,
   wherein the second voltage supply circuit includes:
      a second transistor having: a third power supply node; a fourth power supply node; an intermediate node; a first conduction node coupled to the third power supply node; and a second conduction node coupled to the intermediate node, the second transistor being made conductive on receipt of a second control signal by its gate; and
      a third transistor having: a third conduction node coupled to the fourth power supply node; and a fourth conduction node coupled to the intermediate node, the third transistor being selectively made conductive in accordance with a third control signal, and
   wherein the intermediate node is coupled to the first power supply node.

4. The semiconductor memory device according to claim 1,
   wherein the voltage supply circuit includes: a first voltage supply circuit for supplying the first voltage; and a second voltage supply circuit for supplying the second voltage,
   wherein the first voltage supply circuit includes:
      a first transistor having: a second power supply node; a first conduction node coupled to the second power supply node; and a second conduction node coupled to a first power supply node of the word line driver, the first transistor being selectively made conductive according to a first control signal,
   wherein the second voltage supply circuit includes:
      a second transistor having: a third power supply node; a fourth power supply node; an intermediate node; a third conduction node coupled to the third power supply node; and a fourth conduction node coupled to the intermediate node, the second transistor receiving a second control signal by its gate; and
      a third transistor having: a fifth conduction node coupled to the fourth power supply node; and a sixth conduction node coupled to the intermediate node, the third transistor being selectively made conductive according to a third control signal, and
   wherein the intermediate node is coupled to the first power supply node.

5. The semiconductor memory device according to claim 4, wherein the second voltage is equal to or less than the first voltage.

6. The semiconductor memory device according to claim 4, wherein the second and third power supply nodes are coupled to a common fifth power supply node.

7. The semiconductor memory device according to claim 4, further comprising a first gate signal control circuit for generating a first control signal supplied to the gate of the first transistor when an operation mode instruction signal is made inactive.

8. The semiconductor memory device according to claim 4, further comprising a second gate signal control circuit for setting a third control signal supplied to the gate of the third transistor when an operation mode instruction signal is made active.

9. The semiconductor memory device according to claim 4, further comprising a control circuit for generating a first control signal supplied to the gate of the first transistor, and a third control signal supplied to the gate of the third transistor,
wherein the control circuit sets the first control signal to a first potential state and the third control signal to a second potential state in a standby mode, and sets the first control signal to the second potential state and the third control signal to the first potential state in a reading mode.

10. The semiconductor memory device according to claim 4, wherein channel width of the first transistor is wider than that of the second transistor.

11. The semiconductor memory device according to claim 4, wherein the third transistor has a plurality of transistor elements arranged in parallel, and gate voltage of each of the transistor elements is set according to a control signal generated on the basis of the third control signal.

12. The semiconductor memory device according to claim 4, wherein a first wire coupling the voltage supply circuit and a first power supply node of a word line driver is disposed in a column extension direction, and the semiconductor memory device further comprises a second wire whose one end is coupled to the first wire and disposed in a row extension direction.

13. The semiconductor memory device according to claim 4, wherein the second transistor is always made conductive in a reading mode.

14. The semiconductor memory device according to claim 1, further comprising: a driver power supply line coupling an output of the voltage supply circuit and the first power supply node of the word line driver to each other and transmitting voltage output from the voltage supply circuit; and a capacitive element whose first electrode is coupled to the driver power supply line.

* * * * *